(12) United States Patent
LaBerge et al.

(10) Patent No.: US 8,793,460 B2
(45) Date of Patent: *Jul. 29, 2014

(54) MEMORY SYSTEM AND METHOD USING STACKED MEMORY DEVICE DICE, AND SYSTEM USING THE MEMORY SYSTEM

(71) Applicant: Micron Technology, Inc., Boise, ID (US)

(72) Inventors: Paul A. LaBerge, Shoreview, MN (US); Joseph M. Jeddeloh, Shoreview, MN (US); James B. Johnson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/010,159

(22) Filed: Aug. 26, 2013

(65) Prior Publication Data

US 2013/0346722 A1    Dec. 26, 2013

Related U.S. Application Data

(60) Continuation of application No. 13/209,273, filed on Aug. 12, 2011, now Pat. No. 8,533,416, which is a continuation of application No. 12/961,291, filed on Dec. 6, 2010, now Pat. No. 8,010,866, which is a division of application No. 12/176,951, filed on Jul. 21, 2008, now Pat. No. 7,855,931.

(51) Int. Cl.
   *G06F 13/00*    (2006.01)

(52) U.S. Cl.
   USPC .......................................... 711/167; 711/156

(58) Field of Classification Search
   USPC ................ 711/167, 156; 365/230.03, 230.12, 365/233.12
   See application file for complete search history.

(56) References Cited

U.S. PATENT DOCUMENTS

| | | | |
|---|---|---|---|
| 5,179,303 A | 1/1993 | Searles et al. | |
| 5,263,032 A | 11/1993 | Porter et al. | |

(Continued)

FOREIGN PATENT DOCUMENTS

| | | |
|---|---|---|
| CN | 101036131 A | 9/2007 |
| JP | 05-265872 | 10/1993 |

(Continued)

OTHER PUBLICATIONS

International Search Report and Written Opinion dated Feb. 11, 2010 for International Application No. PCT/US2009/050155.

(Continued)

*Primary Examiner* — Vu Le
(74) *Attorney, Agent, or Firm* — Dorsey & Whitney LLP

(57) ABSTRACT

A memory system and method uses stacked memory device dice coupled to each other and to a logic die. The logic die may include a timing correction system that is operable to control the timing at which the logic die receives signals, such as read data signals, from each of the memory device dice. The timing correction controls the timing of the read data or other signals by adjusting the timing of respective strobe signals, such as read strobe signals, that are applied to each of the memory device dice. The memory device dice may transmit read data to the memory device at a time determined by when it receives the respective strobe signals. The timing of each of the strobe signals is adjusted so that the read data or other signals from all of the memory device dice are received at the same time.

20 Claims, 7 Drawing Sheets

(56) References Cited

U.S. PATENT DOCUMENTS

| | | | |
|---|---|---|---|
| 5,748,914 A | 5/1998 | Barth et al. | |
| 5,774,475 A | 6/1998 | Qureshi | |
| 5,960,008 A | 9/1999 | Osawa et al. | |
| 5,982,684 A | 11/1999 | Schwartzlow et al. | |
| 6,052,329 A | 4/2000 | Nishino et al. | |
| 6,122,688 A | 9/2000 | Barth et al. | |
| 6,177,807 B1* | 1/2001 | Bertin et al. | 326/30 |
| 6,181,616 B1 | 1/2001 | Byrd | |
| 6,247,138 B1 | 6/2001 | Tamura et al. | |
| 6,285,211 B1 | 9/2001 | Sample | |
| 6,363,017 B2 | 3/2002 | Polney | |
| 6,401,213 B1 | 6/2002 | Jeddeloh | |
| 6,519,194 B2 | 2/2003 | Tsujino et al. | |
| 6,574,626 B1 | 6/2003 | Regelman et al. | |
| 6,650,157 B2 | 11/2003 | Amick et al. | |
| 6,658,523 B2 | 12/2003 | Janzen et al. | |
| 6,839,260 B2 | 1/2005 | Ishii | |
| 6,882,304 B2 | 4/2005 | Winter et al. | |
| 6,889,334 B1 | 5/2005 | Magro et al. | |
| 6,907,555 B1 | 6/2005 | Nomura et al. | |
| 7,058,865 B2 | 6/2006 | Mori et al. | |
| 7,107,424 B1 | 9/2006 | Avakian et al. | |
| 7,135,905 B2 | 11/2006 | Teo et al. | |
| 7,149,134 B2 | 12/2006 | Streif et al. | |
| 7,168,005 B2 | 1/2007 | Adams et al. | |
| 7,171,596 B2 | 1/2007 | Boehler | |
| 7,184,916 B2 | 2/2007 | Resnick et al. | |
| 7,197,101 B2 | 3/2007 | Glenn et al. | |
| 7,203,259 B2 | 4/2007 | Glenn et al. | |
| 7,243,469 B2 | 7/2007 | Miller et al. | |
| 7,389,375 B2 | 6/2008 | Gower et al. | |
| 7,464,241 B2 | 12/2008 | Vogt | |
| 7,466,179 B2 | 12/2008 | Huang et al. | |
| 7,489,743 B2 | 2/2009 | Koh et al. | |
| 7,567,476 B2 | 7/2009 | Ishikawa | |
| 7,697,369 B2 | 4/2010 | Koshizuka | |
| 7,710,144 B2 | 5/2010 | Dreps et al. | |
| 7,764,564 B2 | 7/2010 | Saito et al. | |
| 7,772,907 B2 | 8/2010 | Kim et al. | |
| 7,855,931 B2 | 12/2010 | LaBerge et al. | |
| 7,979,757 B2 | 7/2011 | Jeddeloh | |
| 8,010,866 B2 | 8/2011 | LaBerge | |
| 8,127,204 B2 | 2/2012 | Hargan | |
| 8,248,138 B2 | 8/2012 | Liu | |
| 8,289,760 B2 | 10/2012 | Jeddeloh | |
| 8,356,138 B1 | 1/2013 | Kulkarni et al. | |
| 8,400,808 B2 | 3/2013 | King | |
| 2002/0004893 A1 | 1/2002 | Chang | |
| 2002/0054516 A1 | 5/2002 | Taruishi et al. | |
| 2002/0097613 A1 | 7/2002 | Raynham | |
| 2002/0125933 A1 | 9/2002 | Tamura et al. | |
| 2002/0130687 A1 | 9/2002 | Duesman | |
| 2002/0133666 A1 | 9/2002 | Janzen et al. | |
| 2002/0138688 A1 | 9/2002 | Hsu et al. | |
| 2003/0041299 A1 | 2/2003 | Kanazawa et al. | |
| 2003/0132790 A1 | 7/2003 | Amick et al. | |
| 2004/0073767 A1 | 4/2004 | Johnson et al. | |
| 2004/0098545 A1 | 5/2004 | Pline et al. | |
| 2004/0160833 A1 | 8/2004 | Suzuki | |
| 2004/0168101 A1 | 8/2004 | Kubo | |
| 2004/0199840 A1 | 10/2004 | Takeoka et al. | |
| 2004/0206982 A1 | 10/2004 | Lee et al. | |
| 2004/0237023 A1 | 11/2004 | Takahashi et al. | |
| 2004/0246026 A1 | 12/2004 | Wang et al. | |
| 2005/0005230 A1 | 1/2005 | Koga et al. | |
| 2005/0071707 A1 | 3/2005 | Hampel | |
| 2005/0091471 A1 | 4/2005 | Conner et al. | |
| 2005/0144546 A1 | 6/2005 | Igeta et al. | |
| 2005/0157560 A1 | 7/2005 | Hosono et al. | |
| 2005/0174877 A1 | 8/2005 | Cho et al. | |
| 2005/0278490 A1 | 12/2005 | Murayama | |
| 2005/0289435 A1 | 12/2005 | Mulla et al. | |
| 2006/0036827 A1 | 2/2006 | Dell et al. | |
| 2006/0059406 A1 | 3/2006 | Micheloni et al. | |
| 2006/0123320 A1 | 6/2006 | Vogt | |
| 2006/0126369 A1 | 6/2006 | Raghuram | |
| 2006/0233012 A1 | 10/2006 | Sekiguchi et al. | |
| 2006/0245291 A1 | 11/2006 | Sakaitani | |
| 2006/0253723 A1 | 11/2006 | Wu et al. | |
| 2006/0262587 A1 | 11/2006 | Matsui et al. | |
| 2006/0273455 A1 | 12/2006 | Williams et al. | |
| 2007/0058410 A1 | 3/2007 | Rajan | |
| 2007/0070669 A1 | 3/2007 | Tsern | |
| 2007/0074093 A1 | 3/2007 | Lasser | |
| 2007/0136645 A1 | 6/2007 | Hsueh et al. | |
| 2007/0271424 A1 | 11/2007 | Lee et al. | |
| 2008/0147897 A1 | 6/2008 | Talbot | |
| 2008/0150088 A1 | 6/2008 | Reed et al. | |
| 2008/0250292 A1 | 10/2008 | Djordjevic | |
| 2009/0006775 A1 | 1/2009 | Bartley et al. | |
| 2009/0016130 A1 | 1/2009 | Menke et al. | |
| 2009/0021992 A1 | 1/2009 | Oh | |
| 2009/0091968 A1 | 4/2009 | Dietrich et al. | |
| 2009/0196093 A1 | 8/2009 | Happ et al. | |
| 2009/0251189 A1 | 10/2009 | Hsieh | |
| 2009/0300314 A1 | 12/2009 | Laberge et al. | |
| 2009/0300444 A1 | 12/2009 | Jeddeloh | |
| 2010/0005217 A1 | 1/2010 | Jeddeloh | |
| 2010/0005376 A1 | 1/2010 | Laberge et al. | |
| 2010/0014364 A1 | 1/2010 | Laberge et al. | |
| 2010/0031129 A1 | 2/2010 | Hargan | |
| 2010/0042889 A1 | 2/2010 | Hargan | |
| 2010/0070696 A1 | 3/2010 | Blankenship | |
| 2010/0079180 A1 | 4/2010 | Kim et al. | |
| 2010/0091537 A1 | 4/2010 | Best et al. | |
| 2010/0110748 A1 | 5/2010 | Best | |
| 2011/0075497 A1 | 3/2011 | Laberge et al. | |
| 2011/0271158 A1 | 11/2011 | Jeddeloh | |
| 2011/0296227 A1 | 12/2011 | LaBerge et al. | |
| 2012/0144276 A1 | 6/2012 | Hargan | |
| 2012/0155142 A1 | 6/2012 | King | |
| 2013/0208549 A1 | 8/2013 | King | |
| 2013/0318298 A1 | 11/2013 | LaBerge et al. | |
| 2014/0053040 A1 | 2/2014 | Hargan | |

FOREIGN PATENT DOCUMENTS

| | | |
|---|---|---|
| JP | 0774620 | 3/1995 |
| JP | 11-102599 | 4/1999 |
| JP | 11-513830 | 11/1999 |
| JP | 2003-303139 | 10/2003 |
| JP | 2004-327474 | 11/2004 |
| JP | 2005-4947 | 1/2005 |
| JP | 2007-507794 | 3/2007 |
| JP | 2007-140948 | 6/2007 |
| JP | 2007-226876 | 9/2007 |
| JP | 2007-328636 | 12/2007 |
| JP | 2008-112503 | 5/2008 |
| JP | 2008-140220 | 6/2008 |
| JP | 2010-514080 | 4/2010 |
| WO | WO-97/14289 | 4/1997 |
| WO | WO-2005/033958 | 4/2005 |
| WO | WO-2007/038225 | 4/2007 |
| WO | WO-2007/095080 | 8/2007 |
| WO | WO-2008/054696 | 5/2008 |
| WO | WO-2008/076790 | 6/2008 |
| WO | WO-2009/148863 | 12/2009 |
| WO | WO-2010/002561 A2 | 1/2010 |
| WO | Wo 2010/011503 A2 | 1/2010 |
| WO | WO-2012/060097 | 5/2012 |
| WO | WO-2012/082338 | 6/2012 |

OTHER PUBLICATIONS

Notice of Final Rejection dated Feb. 2, 2013 for KR Appl. No. 10-2011-7001535.

Notice of Preliminary Rejection dated Jun. 18, 2012 for KR Appl. No. 10-2011-7001535.

(56) References Cited

OTHER PUBLICATIONS

Office Action received for JP Appln No. 2011-520079 dated Feb. 12, 2013.
CN First Office Action for Appl No. 200980128341.4, Apr. 3, 2013.
Non-Final Office Action for Appl No. 10-2013-7010171, Jun. 14, 2013.
Notice of Rejection for Appl No. 2011-520079 dated Jun. 25, 2013.

TW Office Action for Appl No. 098124606, May 9, 2013.
Extended European Search Report dated Aug. 2, 2011 for European Patent Application No. 09800787.5.
LaBerge, et al., First examination report received for EP 09800787.5 dated Feb. 21, 2013.
Second Office Action issued by State Intellectual Property Office for CN Appl No. 200980128341.4; Issued Nov. 19, 2013.

* cited by examiner

MEMORY SYSTEM AND METHOD USING STACKED MEMORY DEVICE DICE, AND SYSTEM USING THE MEMORY SYSTEM

CROSS-REFERENCE TO RELATED APPLICATIONS

This application is a continuation of U.S. patent application Ser. No. 13/209,273, filed Aug. 12, 2011, and issued as U.S. Pat. No. 8,533,416, on Sep. 10, 2013, which is a continuation of U.S. patent application Ser. No. 12/961,291, filed Dec. 6, 2010, and issued as U.S. Pat. No. 8,010,866 on Aug. 30, 2011, which is a divisional of U.S. patent application Ser. No. 12/176,951 filed Jul. 21, 2008, and issued as U.S. Pat. No. 7,855,931 on Dec. 21, 2010. These applications and patents are incorporated by reference herein in their entirety and for all purposes.

TECHNICAL FIELD

This invention relates to memory devices, and, more particularly, in one or more embodiments to a memory system having a plurality of stacked memory device dice connected to a logic die.

BACKGROUND OF THE INVENTION

As memory devices of all types have evolved, continuous strides have been made in improving their performance in a variety of respects. For example, the storage capacity of memory devices has continued to increase at geometric proportions. This increased capacity, coupled with the geometrically higher operating speeds of electronic systems containing memory devices, has made high memory device bandwidth ever more critical. One application in which memory devices, such as dynamic random access memory ("DRAM") devices, require a higher bandwidth is their use as system memory in computer systems. As the operating speed of processors has increased, processors are able to read and write data at correspondingly higher speeds. Yet conventional DRAM devices often do not have the bandwidth to read and write data at these higher speeds, thereby slowing the performance of conventional computer systems. This problem is exacerbated by the trend toward multi-core processors and multiple processor computer systems. It is currently estimated that computer systems operating as high-end servers are idle as many as 3 out of every 4 clock cycles because of the limited data bandwidth of system memory devices. In fact, the limited bandwidth of DRAM devices operating as system memory can reduce the performance of computer systems to as low as 10% of the performance of which they would otherwise be capable.

Various attempts have been made to increase the data bandwidth of memory devices. For example, wider internal data buses have been used to transfer data to and from arrays with a higher bandwidth. However, doing so usually requires that write data be serialized and read data deserialized at the memory device interface. Another approach has been to simply scale up the size of memory devices or conversely shrink their feature sizes, but, for a variety of reasons, scaling has been incapable of keeping up with the geometric increase in the demand for higher data bandwidths. Proposals have also been made to stack several integrated circuit memory device dice in the same package, but doing so threatens to create a large number of other problems that must be overcome.

One potential problem with stacking memory device dice on top of each other is that it may create signal timing skews between the signals transmitted to or from each of the memory devices. Insofar as the distances between each of the memory devices and an interface for the packaged memory devices will vary for each memory device, the time required for signals to be transmitted to and from each of the memory devices will inherently vary. This can be a considerable problem because there may be a large number of memory device dice in the stack, such as, for example, eight memory devices. Additionally, because of process, temperature and supply voltage variations, the timing performances of the memory devices may vary even if they are fabricated on the same wafer. An example of such signal timing skews is illustrated in FIG. 1, which shows the period during which read data signals are considered valid at a package interface for each of 4 stacked dynamic random access memory ("DRAM") device dice DRAM0-DRAM1. This data valid period is sometimes referred to as a data "eye." As shown therein, the read data for DRAM2 is valid first, followed by DRAM0, DRAM1 and finally DRAM3. The period during which all of the read data, i.e., the composite eye 8 for all of the DRAM, is almost nonexistent. Therefore, it would be very difficult for a memory access device, such as a memory controller or processor, to capture the read data using a single clock signal, particularly as the operating speeds and resulting data transfer rates of memory devices continue to increase.

In the past, the problem of signal skews from different memory devices has been greatly alleviated by transmitting respective read strobe signals from the memory devices along with the respective read data. The strobe signal is then used by the memory access device to capture the read data. Insofar as differences in the timing of read data from each of the memory devices are substantially matched by differences in the timing of the strobe signals, transitions of the strobe signals are substantially centered in the data eye from each memory device, thereby allowing the memory access device to successfully capture the read data from each of the memory devices. As the operating speed of memory devices have continued to increase, even this approach has not been sufficient. As a result, techniques have been developed to adjust the timing of the strobe signals by either adjusting their transmit times at the memory devices or by delaying them by adjustable amounts in the memory access device. Alternatively, the timing of each of the bits of the read data can be adjusted relative to the timing of the read strobe signal. An example of a memory device that adjusts the timing of each bit of read data in this manner is described in U.S. Pat. No. 6,882,304.

The conventional approach of adjusting the timing between a read strobe signal and read data signals could be used for stacked memory device dice. However, doing so would require an extensive amount of timing adjustment circuitry in each memory device, thereby reducing the area of each memory device dice available for providing memory capacity. Adjusting the timing between a read strobe signal and read data signal in each memory device die would also require sending a read strobe signal from each memory device. Furthermore, although the timing problems have been discussed with respect to read data signals, essentially the same type of problems can exist with write data signals, command signals and address signals. If a separate strobe signal was transmitted to or from each memory device for each of these types of signals, the strobe signals would require that the packaged memory devices include a large number of strobe terminals. For example, if eight memory device dice were stacked, 32 terminals would be required to transfer a strobe signal to or from the memory devices of all these types of signals. Yet, it is generally considered undesirable to unduly increase the number of terminals in a memory device because of the lack of available area in a memory device package and the large number of conductors that would be required in the bus or circuit board on which the memory device was mounted.

Therefore, a need exists for a method and apparatus to minimize problems and limitations resulting from timing skews between signals transmitted to or from stacked memory device dice in a manner that maximizes the area of a die available for memory capacity and does not unduly increase the number of required terminals.

DETAILED DESCRIPTION

Figure 2:
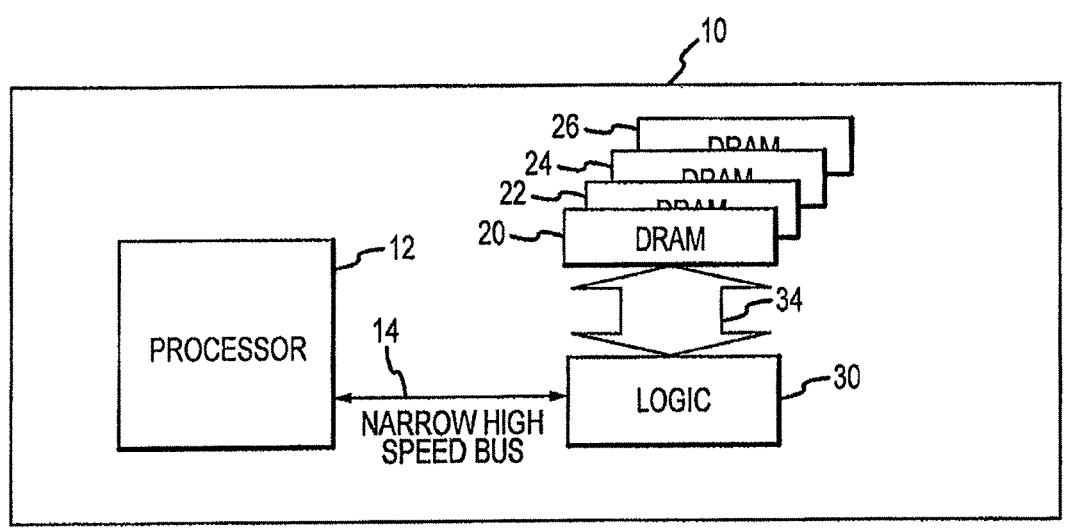
FIG. 2 is a block diagram of a processor-based system that includes a memory system containing stacked memory device dice according to an embodiment of the invention.

A computer system including a high-capacity, high bandwidth memory system 10 according to an embodiment of the invention is shown in FIG. 2. The memory system 10 is connected to a processor 12 through a relatively narrow high-speed bus 14 that is divided into downstream lanes and separate upstream lanes (not shown in FIG. 2). The memory system 10 includes 4 DRAM dice 20, 22, 24, 26, which may be identical to each other, stacked on top of each other. Although the memory system 10 includes 4 DRAM dice 20, 22, 24, 26, other embodiments of the memory device use a greater or lesser number of DRAM dice. The stacked DRAM dice 20, 22, 24, 26 are connected to a logic die 30, which serves as the interface with the processor 12. The logic die 30 can be physically positioned relative to DRAM dice 20, 22, 24, 26 in any order, such as by stacking the DRAM dice 20, 22, 24, 26 on top of the logic die 30. However, the logic die 30 could, for example, be positioned in the middle of the stack of DRAM dice 20, 22, 24, 26.

The logic die 30 can implement a variety of functions in the memory system 10, such as to limit the number of functions that must be implemented in the DRAM dice 20, 22, 24, 26. For example, the logic die 30 may perform memory management functions, such as power management and refresh of memory cells in the DRAM dice 20, 22, 24, 26. In some embodiments, the logic die 30 may perform error checking and correcting ("ECC") functions. In the embodiments described herein, the logic die 30 implements the timing correction of signals that the logic die 30 couples to or receives from the DRAM dice 20, 22, 24, 26, as explained in greater detail below.

The DRAM dice 20, 22, 24, 26 may be connected to each other, and they are connected to the logic die 30 by a relatively wide bus 34. The bus 34 may be implemented with through silicon vias ("TSVs"), which comprise a large number of conductors extending at least partially through the DRAM dice 20, 22, 24, 26 at the same locations on the DRAM dice and connect to respective conductors formed on the dice 20, 22, 24, 26. In one embodiment, each of the DRAM dice 20, 22, 24, 26 are divided into 16 autonomous partitions, each of which may contain 2 or 4 independent memory banks. In such case, the partitions of each dice 20, 22, 24, 26 that are stacked on top of each other may be independently accessed for read and write operations. Each set of 16 stacked partitions may be referred to as a "vault." Thus, the memory system 10 may contain 16 vaults.

Figure 1:
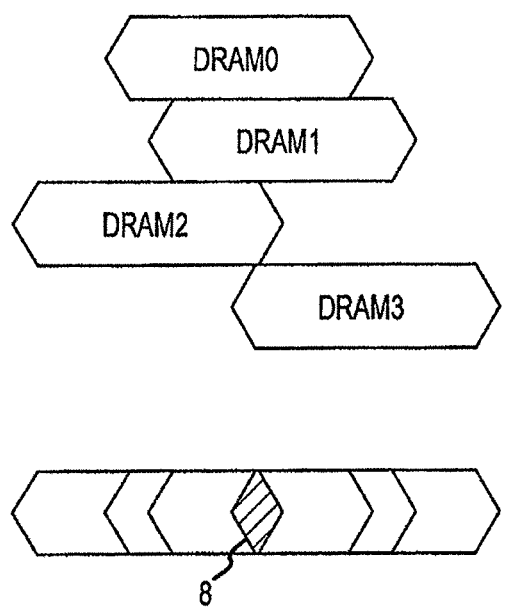
FIG. 1 is a timing diagram showing the manner in which the timing of read data signals from each of a plurality of stacked memory device dice are skewed relative to each other.
Figure 3:
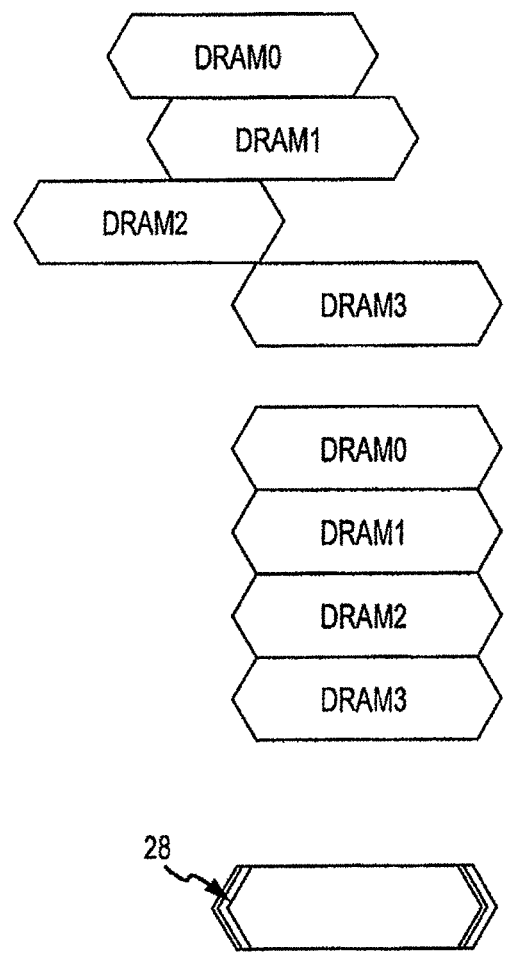
FIG. 3 is a timing diagram showing the timing of read data signals shown in FIG. 1 along with read data signal having corrected timing according to an embodiment of the invention.

As mentioned above, the logic die 30 contains timing correction circuitry for ensuring that read data signals received from the memory device dice 20, 22, 24, 26 are aligned with each other when they are transmitted from the memory system 10. As shown in FIG. 3, the logic die 30 causes the read data signals that would be received from the memory device dice 20, 22, 24, 26 as shown in FIG. 1 so that they are substantially aligned with each other. As a result, the read data signals are transmitted from the memory system 10 with a composite eye 28 that is substantially larger than the virtually non-existent composite eye 8 shown in FIG. 1.

As explained in greater detail below, one of the functions performed by the logic die 30 is to serialize the read data bits coupled from the DRAM dice 20, 22, 24, 26 into a serial stream of 16 serial data bits coupled through each of 16 parallel bits of one of the upstream lanes 42a-d of the bus 14. Similarly, the logic die 30 may perform the functions of deserializing 16 serial data bits coupled through one of the 16-bit downstream lanes 40a-d of the bus 14 to obtain 256 parallel data bits. The logic die 30 then couples these 256 bits through one of the 32-bit sub-buses 38a-p in a serial stream of 8 bits. However, other embodiments may use different numbers of lanes 40, 42 having different widths or different numbers of sub-buses 38a-p having different widths, and they may couple data bits having different structures. As will be appreciated by one skilled in the art, the stacking of multiple DRAM dice results in a memory device having a very large capacity. Further, the use of a very wide bus connecting the DRAM dice allows data to be coupled to and from the DRAM dice with a very high bandwidth.

Figure 4:
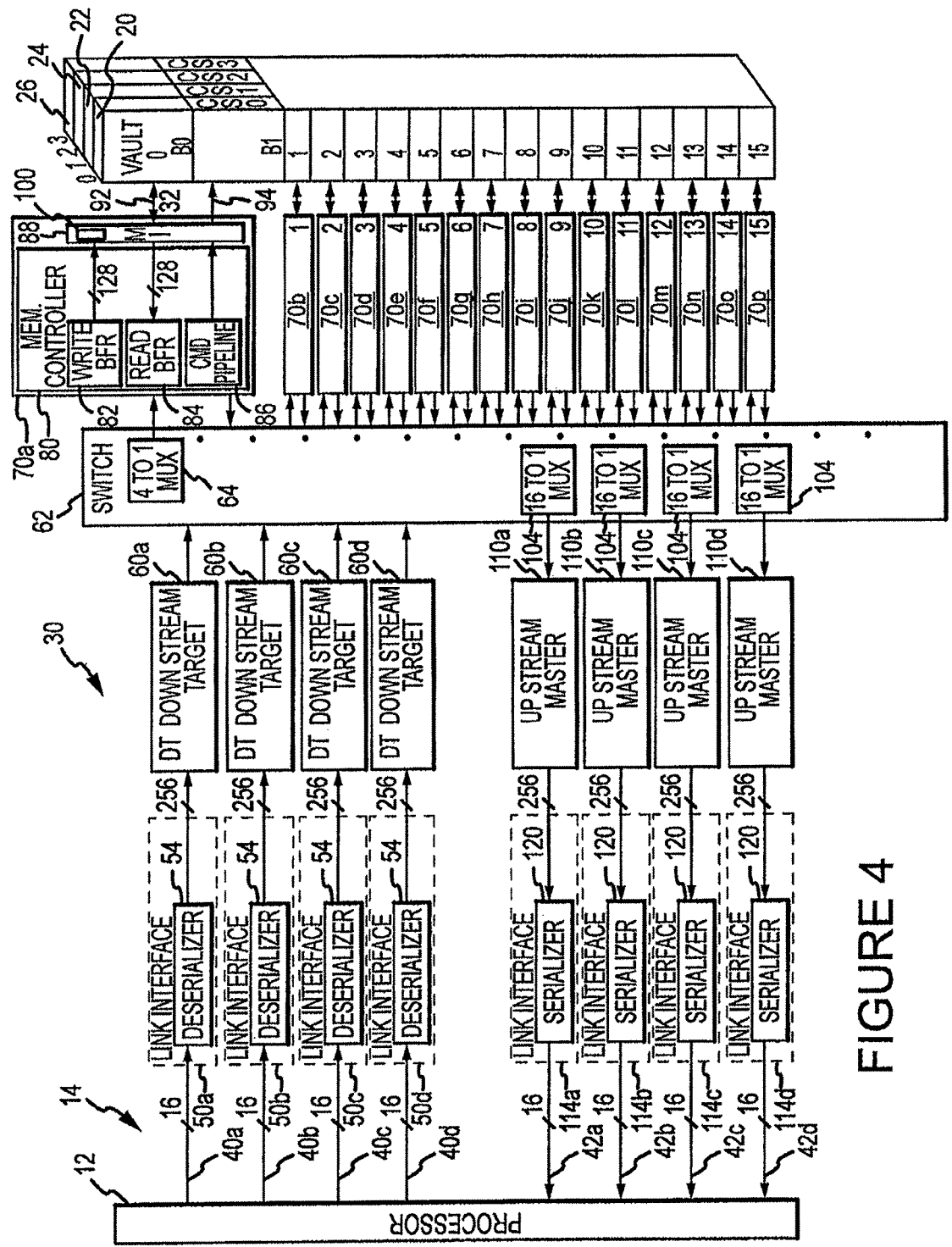
FIG. 4 is a more detailed block diagram of an embodiment of the processor-based system of FIG. 2 showing the memory system in greater detail.

A logic die 30 according to an embodiment of the invention is shown in FIG. 4 connected to the processor 12 and the DRAM dice 20, 22, 24, 26. As shown in FIG. 4, each of the 4 downstream lanes 40a-d is connected to a respective link interface 50a-d. Each link interface 50a-d includes a deserializer 54 that converts each serial stream of 16 data bits on each of the 16-bit lanes 40a-d to 256 parallel bits. Insofar as there are 4 link interfaces 50a-d, the link interfaces can together output 1024 output parallel bits.

Each of the link interfaces 50a-d applies its 256 parallel bits to a respective downstream target 60a-d, which decodes the command and address portions of the received packet and buffers write data in the event a memory request is for a write operation. The downstream targets 60a-d output their respective commands, addresses and possibly write data to a switch 62. The switch 62 contains 16 multiplexers 64 each of which direct the command, addresses and any write data from any of the downstream targets 60a-d to its respective vault of the DRAM dice 20, 22, 24, 26. Thus, each of the downstream targets 60a-d can access any of the 16 vaults in the DRAM dice 20, 22, 24, 26. The multiplexers 64 use the address in the received memory requests to determine if its respective vault is the target of a memory request. Each of the multiplexers 64 apply the memory request to a respective one of 16 vault controllers 70a-p.

Each vault controller 70a-p includes a respective memory controller 80, each of which includes a write buffer 82, a read buffer 84 and a command pipeline 86. The commands and addresses in memory requests received from the switch 62 are loaded into the command pipeline 86, which subsequently outputs the received commands and corresponding addresses. Any write data in the memory requests are stored in the write buffer 82. The read buffer 84 is used to store read data from the respective vault, as will be explained in greater detail below. Both the write data from the write buffer 82 and the commands and addresses from the command pipeline 86 of each of the vault controllers 70a-p are applied to a memory interface 88. The memory interface 88 couples commands and addresses from the command pipelines 86 to the DRAM dice 20, 22, 24, 26 through a command/address bus 94, and it couples 32-bits of write data from each of the write buffers 82 to the DRAM dice 20, 22, 24, 26 through a 32-bit data bus 92.

Although data are loaded into the write buffer 82 as 256 parallel bits, they are output from the buffer 82 in two sets, each set being 128 parallel bits. These 128 bits are then further serialized by the memory interface 88 to 4 sets of 32-bit data, which are coupled through the data bus 92. In the embodiment shown in FIG. 4, write data are coupled to the write buffer 82 in synchronism with a 500 MHz clock so the data are stored in the write buffer at 16 gigabytes ("GB") per second. The write data are coupled from the write buffer 82 to the DRAM dice 20, 22, 24, 26 using a 2 GHz clock so the data are output from the write buffer 82 at 8 GB/s. Therefore, as long as more than half of the memory requests are not write operations to the same vault, the write buffers 82 will be able to couple the write data to the DRAM dice 20, 22, 24, 26 at least as fast as the data are coupled to the write buffer 82.

In the event a memory request is for a read operation, the command and address for the request are coupled to the DRAM dice 20, 22, 24, 26 in the same manner as a write request, as explained above. In response to a read request, 32 bits of read data are output from the DRAM dice 20, 22, 24, 26 through the 32-bit data bus 92. The memory interface 88 deserializes the 32 bits of read data from each of the vaults into two sets of 128-bit read data, which are applied to the read buffer 84. After 2 sets of 128-bit read data have been stored in the read buffer 84, the read buffer transmits 256 bits to the switch 62. The switch includes 4 output multiplexers 104 coupled to respective upstream masters 110a-d. Each multiplexer 104 can couple 256 bits of parallel data from any one of the vault controllers 70a-p to its respective upstream master 110a-d. The upstream masters 110a-d format the 256 bits of read data into packet data and couple the packet to respective upstream link interfaces 114a-d. Each of the link interfaces 114a-d include a respective serializer 120 that converts the incoming 256 bits to a serial stream of 16 bits on each bit of a respective one of the 16-bit upstream links 42a-d.

Figure 5:
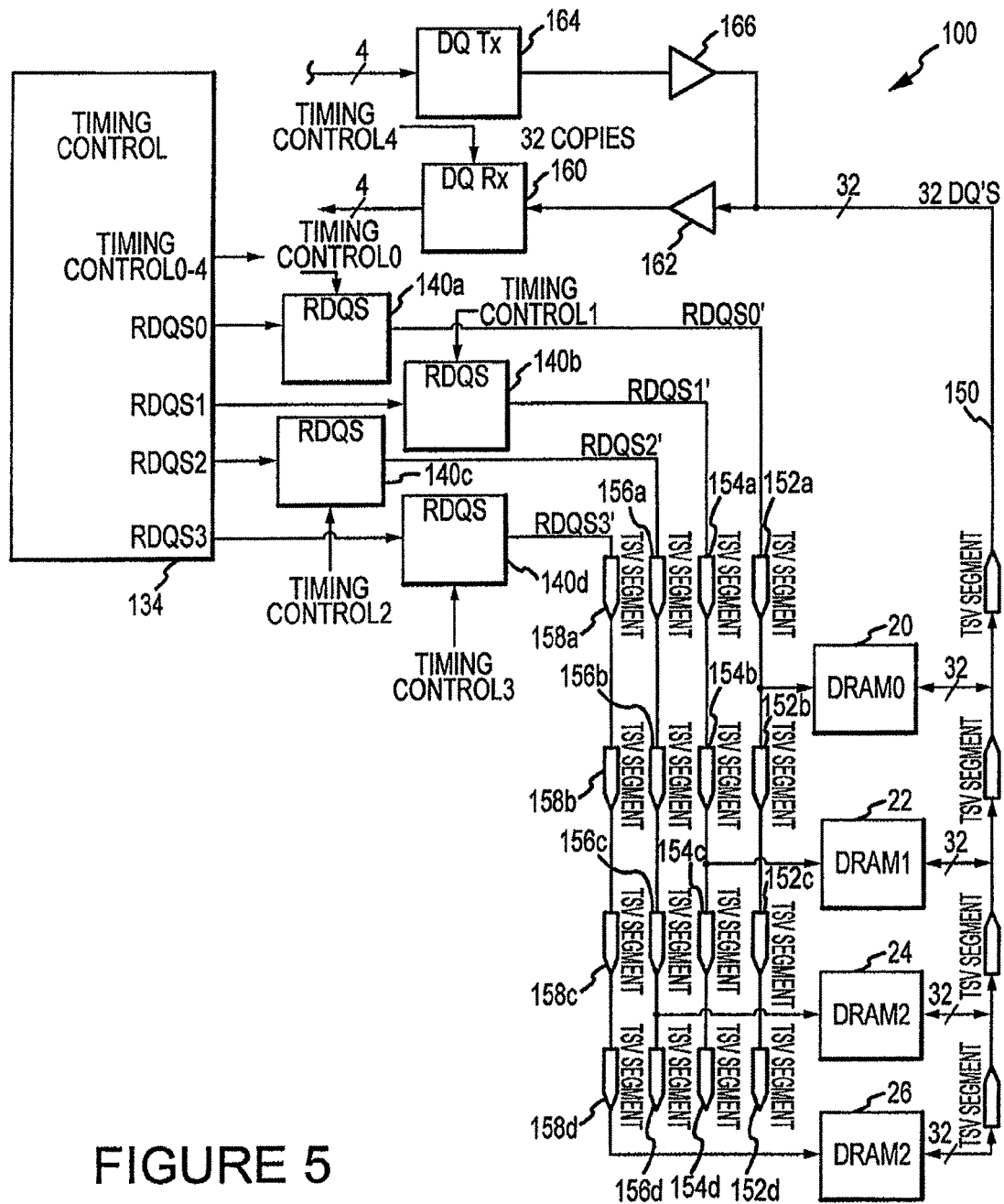
FIG. 5 is a block diagram showing an embodiment of a timing correction system used in the memory system of FIGS. 2 and 4.

As explained above, the logic die 30 corrects the timing of signals that the logic die 30 couples to or receives from the DRAM dice 20, 22, 24, 26, as explained in greater detail below. This timing correction is implemented by a timing correction system 100, one of which is included in each of the memory interfaces 88. An embodiment of the timing correction system 100 is shown in FIG. 5. The system 100 includes a timing control circuit 134 that outputs 4 read data strobe signals RDQS0-RDQS3. The strobe signals RDQS0-RDQS3 are in a pattern of alternating high and low logic levels. Each of the strobe signals RDQS0-RDQS3 is applied to a respective one of 4 strobe timing adjustment circuits 140a-d, each of which receives a respective timing control signal from the timing control circuit 134. Each of the 4 strobe timing adjustment circuits 140a-d transmit respective adjusted read data strobe signals RDQS0'-RDQS3' to a respective one of the DRAM device dice 20, 22, 24, 26. Thus, the strobe timing adjustment circuit 140a transmits its strobe signal RDQS0' to the first DRAM device die 20 through a TSV 152a extending from the logic die 30 to the DRAM device die 20. The strobe signal RDQS0' may also be coupled through additional TSVs 152b-d extending to the other DRAM device dice 22, 24, 26, but they are not internally connected to any circuitry in the respective DRAM device dice 22, 24, 26. Similarly, the strobe timing adjustment circuit 140b transmits its strobe signal RDQS1' to the second DRAM device die 22 through two TSVs 154a,b, the strobe timing adjustment circuit 140c transmits its strobe signal RDQS2' to the third DRAM device die 24 through three TSVs 156a,b,c, and the strobe timing adjustment circuit 140d transmits its strobe signal RDQS3' to the fourth DRAM device die 26 through four TSVs 158a,b,c,d.

In response to each of the read data strobe signals RDQS0'-RDQS3', the respective DRAM device dice 20, 22, 24, 26 output 32 bits of read data on a common 32-bit bus 150. Each of the bits of the read data is applied through a respective input buffer 162 to a respective one of 32 receivers 160 (only 1 of which is shown in FIG. 5). Thus, each of the memory interfaces 88 shown in FIG. 4 contains 32 receivers 160. Each receiver 160 deserializes the received bit of read data into 4 bits of read data. Thus, the 32 bits of read data collectively received by the 32 receivers 160 result in 128 bits of read data. In a similar manner, a respective transmitter 164 is connected to each bit of the bus 150 so that each of the memory interfaces 88 shown in FIG. 4 contains 32 transmitters 164 (only 1 of which is shown in FIG. 5). Each of the transmitters 164 transmits 4 bits of write data through a respective output buffer 166 and serializes the data into 1 bit of write data that is applied to its respective bit of the bus 150.

The timing of the read data being transmitted from each of the DRAM device dice 20, 22, 24, 26 is controlled by the timing of its respective read data strobe signals RDQS0'-RDQS3'. The timing control signals output from the timing control circuit 134 cause the respective strobe timing adjustment circuits 140a-d to properly adjust the timing of the read data strobe signals RDQS0'-RDQS3' so that the read data is received at the logic die 30 from each of the DRAM device dice 20, 22, 24, 26 with the same timing. As a result, the receivers 160 can capture the read data using the same clock signal CLK regardless of which DRAM device dice 20, 22, 24, 26 transmitted the read data. Therefore, the logic die 30 can transmit the read data from the memory system with the same timing without any additional timing adjustments regardless of which DRAM device dice 20, 22, 24, 26 was the originator of the data.

In one embodiment of the timing control circuit 134, a conventional training sequence is used to determine the correct timing of each of the strobe signals RDQS0'-3', such as is disclosed in U.S. Pat. No. 6,882,304. The timing control circuit 134 causes the timing of each of the strobe signals RDQS0'-3' to be incrementally adjusted while the receivers 160 attempt to capture known read data. The timing that best captures the read data is then used during normal operation. The optimum timing can be determined, for example, by using a timing that is midway between all of the timing values that successfully captured the read data.

The disclosed embodiment of the memory interface 88 uses the timing control circuit 100 only to adjust the timing of the read data. However, in other embodiments, a similar timing control circuit 100 adjusts the timing of write data signals, command signals and/or address signals in a similar manner. In each case, the timing control circuit can vary the timing of these signals transmitted to the DRAM device dice 20, 22, 24, 26 so they are received by the DRAM device dice at the proper time. The proper timing can be determined by conducting a read operations as the timing of these signals are incrementally varied to determine which timing can best be captured in the DRAM device dice 20, 22, 24, 26. Also, although the timing control circuit 100 is used to apply properly timed read strobe signals to 4 DRAM device dice 20, 22, 24, 26, other embodiments are used with lesser or additional numbers of DRAM device dice.

Figure 6:
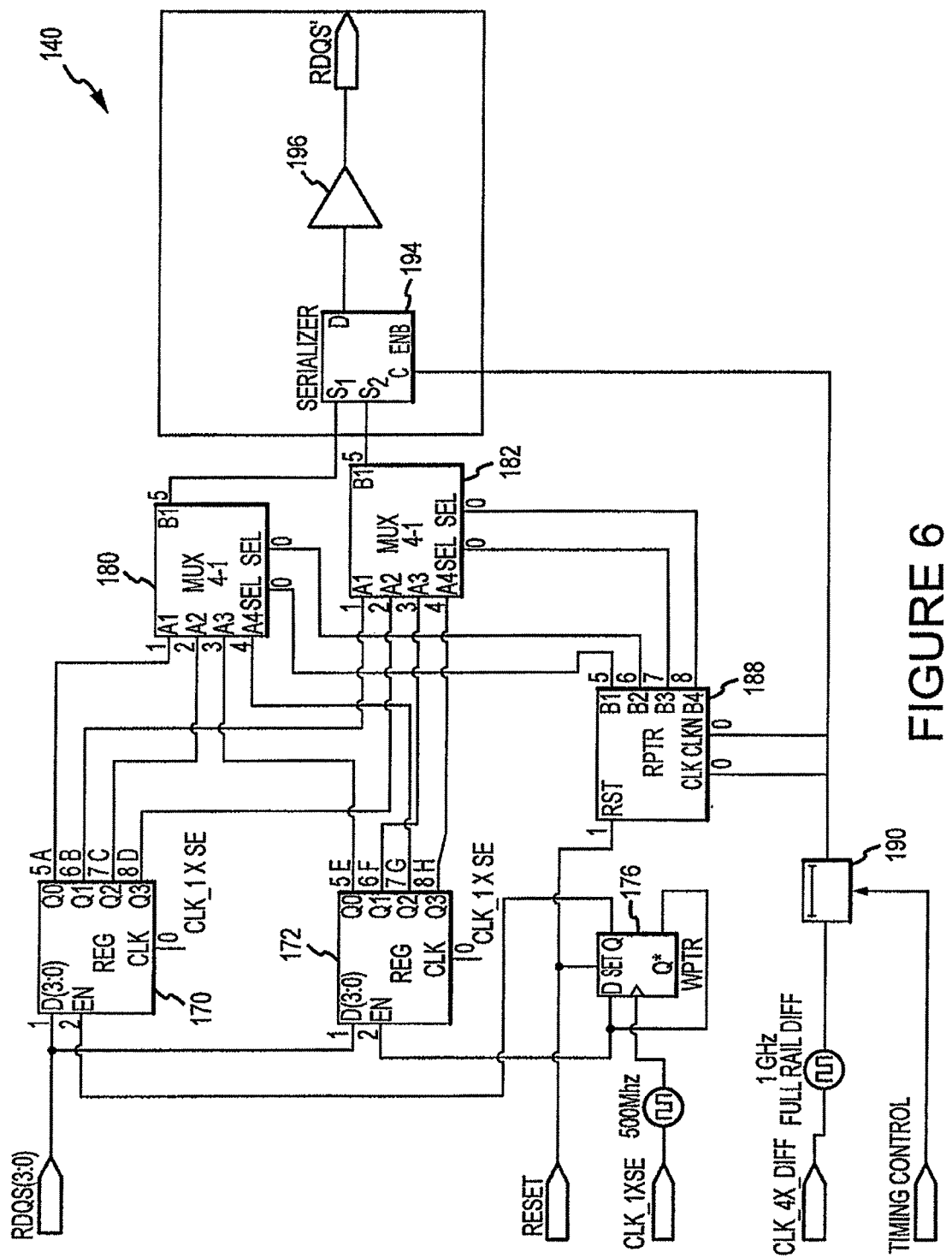
FIG. 6 is a block diagram showing an embodiment of a strobe timing adjustment circuit used in the timing correction system of FIG. 5.

An embodiment of each of the strobe timing adjustment circuits 140*a-d* is shown in FIG. 6. Although only one timing adjustment circuit 140 is shown in FIG. 6, it will be understood that 4 of them would be used in the timing control circuit 100 of FIG. 5. As explained above, the timing adjustment circuit 140 receives a respective read data strobe signal RDQS, which consists of alternating high and low logic levels, which may be labeled A-H. The RDQS signal is applied to two registers 170, 172, each of which has 4 outputs Q0-Q3. The registers 170, 172 are alternately enabled by respective complementary enable signals received from respective outputs of a flip-flop 176. The flip-flop 176 is configured to toggle so that it switches states responsive to each rising edge of a clock signal CLK_1XSE. In one embodiment, the clock signal CLK_1XSE has a frequency of 500 MHz, so that the flip-flop 176 outputs signal Q high for 4 ns and then output Q* high for 4 ns. Therefore, the flip-flop 176 first enables the register 170 for 4 ns and then enables the register 172 for 4 ns. However, in other embodiments, the clock signal CLK_1XSE has different frequencies. Therefore, the register 170 outputs the signals designated A-D in the read data strobe signal RDQS, and the register 172 outputs the signals designated E-H in the read data strobe signal RDQS.

The signals output by registers 170, 172 are applied to two multiplexers 180, 182. More specifically, the signals designated A, C, E, G from the registers 170, 172 are applied to respective inputs of the multiplexer 180, and the signals designated B, D, F, H from the registers 170, 172 are applied to respective inputs of the multiplexer 182. The multiplexers 180, 182 are controlled by respective select signals to cause one of its inputs to be applied to its output. The select signals are generated by a selector 188, which may be implemented using a specially configured counter. The selector 188 is clocked by a clock signal CLK_4X, which, in one embodiment, has a frequency of 1 GHz and is a differential clock signal so that the clock signals have different states. However, the clock signals CLK_4X are coupled through a delay circuit 190, which may be, for example, a delay line or a phase interpolator. The delay circuit 190 delays the clock signals CLK_4X by an adjustable delay that is controlled by the respective timing control signal from the timing control circuit 134 (FIG. 5). The selector 188 first causes the multiplexer 180 to output the signal A from the register 170, and it then causes the multiplexer 182 to output the signal B from the register 170. Similarly, the selector 188 then causes the multiplexer 180 to output the signal C from the register 170, and it then causes the multiplexer 182 to output the signal D from the register 170. In like manner, the selector 188 causes the multiplexer 180, 182 to sequentially output the signals E-H. The respective outputs of the multiplexers 180, 182 are applied to respective inputs of a serializer 194.

In addition to the clock signals CLK_4X being applied to the selector 188, one of the clock signals CLK_4X is applied to a clock input of the serializer 194. The clock signal alternately selects each of its inputs and couples them to its output. Thus, although signals designated A,C,E,G are applied to one input and signals B,D,F,H are applied to the other input, the serializer 194 outputs a signal in the order A,B,C,D,E,F,G,H. As a result, the serializer 194 outputs the original read strobe signal RDQS applied to the registers 170, 172 except that the timing of the strobe signal RDQS has been adjusted by the timing control signal to generate the timing adjusted read strobe signal RDQS'. This RDQS' signal is transmitted through an output buffer 196 to its respective DRAM device dice 20, 22, 24, 26, as explained above with reference to FIG. 5. Thus, the selector 188, the multiplexers 180, 182 and serializer 188 together implement a serializing circuit.

Figure 7:
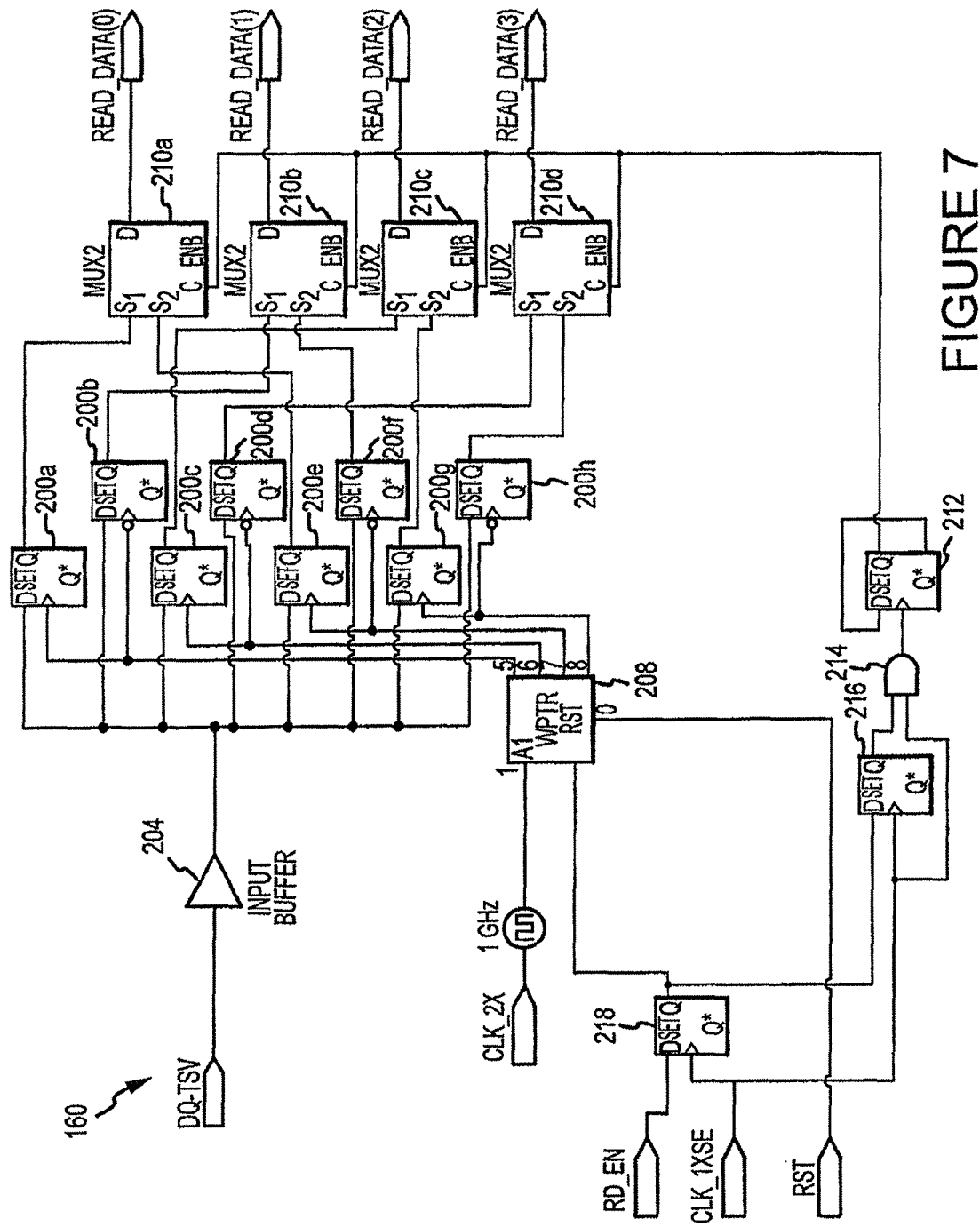
FIG. 7 is a block diagram showing an embodiment of a receiver used in the timing correction system of FIG. 5.

An embodiment of the receiver 160 shown in FIG. 5 is shown in FIG. 7. The receiver 160 receives one bit of read data DQ, which, in one embodiment, consists of 8 bits of serial read data, and deserializes it as explained above with reference to FIG. 5. These serial bits of read data DQ will be designated bits A-H for purposes of facilitating an explanation of the receiver 160. The read data bit is applied to the respective data input of 8 flip-flops 200*a-h* after being coupled through an input buffer 204. The flip-flops 200*a-h* are clocked by a selector 208, which may be implemented by a counter. However, alternating flip-flops 200*a,c,e,g* are clocked by the rising edge of a signal received from the selector 208, while the flip-flops 200*b,d,f,h* are clocked by the falling edge of a signal received from the selector 208. Additionally, the same signal is applied to adjacent flip flop 200*a,b* through 200*g,h*.

When the selector 208 is clocked, each of its outputs sequentially transitions high responsive to rising edges of the clock signal CLK_2X, which, in one embodiment, has a frequency of 1 GHz. Thus the flip-flop 200*a* first outputs the serial read data bit A, and continues to do so until it is clocked again 4 ns later when the received signal from the selector 208 again transitions high. The flip-flop 200*b* is clock 1 ns later by the falling edge of the same signal that clocked the flip-flop 200*a*, so that the flip-flop 200*b* outputs the serial read data bit B for 4 ns. However, at the same time that the signal applied to the flip-flops 200*a,b* transitions low, the signal applied to the flip-flops 200*c,d* transitions high to cause the flip-flop 200*c* to output the serial read data bit C for 4 ns. In a similar manner, the flip-flops 200*d-g* sequentially output read data bits designated D-G. At the end of 4 ns, all of the serial data bits A-G will have been output from the flip-flops 200*a-h*.

The output from each of the first 4 flip flops 200*a-d* are applied to a first input of a respective multiplexers 210*a-d*, and the output from each of the second 4 flip flops 200*e-h* are applied to a second input of the respective multiplexers 210*a-d*. The multiplexers 210*a-d* are each controlled by a signal received from a flip-flop 212, which is configured to toggle responsive to a signal from an AND gate 214. The AND gate 214 receives at one of its inputs the clock signal CLK_1XSE which, it may be recalled, has a frequency of 500 MHz in one embodiment. The other input of the AND gate 214 receives a signal from the output of a flip-flop 216. The flip-flop 216 has a data input that receives a signal from the output of a flip-flop 218. The flip-flop 218 receives a read enable signal RD_EN at its data input, and it is clocked by the clock signal CLK_1XSE.

In operation, when the read enable signal RD_EN transitions high, the next rising edge of the clock signal CLK_1XSE causes the flip-flop 218 to output a high that is applied to the data input of the flip-flop 216. This high output signal from the flip-flop 218 is also applied to the enable input of the selector 208 to allow it to begin clocking the flip-flops 200a-h so that they can collectively output the serial read data bits. On the next rising edge of the clock signal CLK_1XSE, the flip-flop 216 transitions high, thereby causing the output of the AND gate 214 to transition high. The flip-flop 212 is then clocked, and it continues to be clocked by the clock signal CLK_1XSE until the RD_EN signal transitions low at the end of a read operation. Insofar as the flip-flop 212 is configured to toggle, it outputs a signal that is high for 4 ns and then low for 4 ns. As a result, the multiplexers 210a-d output serial data bits A-D for 4 ns, and they then output serial data bits E-H for 4 ns. Thus, the 8 ns that it takes to output bits A-H coincides with the 8 ns that the 8 serial data bits A-H are applied to the receiver 160. Of course, the timing and frequency examples have been provided herein for purposes of explanation, and may be different for other embodiments.

From the foregoing it will be appreciated that, although specific embodiments of the invention have been described herein for purposes of illustration, various modifications may be made without deviating from the spirit and scope of the invention. For example, although the embodiments of the invention are explained in the context of stacked DRAM dice, it will be understood that the stacked die may be other types of memory device die, such as flash memory device die. Accordingly, the invention is not limited except as by the appended claims.

What is claimed is:

1. An apparatus, comprising:
a timing control circuit configured to provide a plurality of data strobe signals and a plurality of timing control signals;
a plurality of strobe timing adjustment circuits, a strobe timing adjustment circuit of the plurality of strobe timing adjustment circuits configured to receive a data strobe signal of the plurality of data strobe signals and a timing control signal of the plurality of timing control signals, the strobe timing adjustment circuit of the plurality of strobe timing adjustment circuits further configured to provide an adjusted clock signal based, at least in part, on the timing control signal of the plurality of timing control signals and to provide the data strobe signal of the plurality of data strobe signals in accordance with the adjusted clock signal.

2. The apparatus of claim 1, wherein the data strobe signal of the plurality of data strobe signals comprises a pattern of alternating high and low logic levels.

3. The apparatus of claim 1, wherein the timing control signal is a first timing control signal, the apparatus further comprising a receiver configured to receive a second timing control signal of the plurality of timing control signals, the receiver further configured to deserialize data in accordance with the second timing control signal of the plurality of timing control signals.

4. The apparatus of claim 1, the strobe timing adjustment circuit of the plurality of strobe timing adjustment circuits is configured to delay a clock signal with an adjustable delay to provide the adjusted clock signal, wherein the adjustable delay is based, at least in part, on the timing control signal of the plurality of timing control signals.

5. The apparatus of claim 1, wherein the adjustable delay is based, at least in part, a distance between the strobe timing adjustment circuit of the plurality of strobe timing adjustment circuits and a memory of a plurality of memories.

6. The apparatus of claim 1, wherein the timing control circuit configured to provide a plurality of data strobe signals is configured to vary a timing of each data strobe signal of the plurality of data strobe signals.

7. The apparatus of claim 1, further comprising:
a plurality of memories, a memory of the plurality of memories coupled to the strobe timing adjustment circuit of the plurality of strobe timing adjustment circuits and configured to receive the data strobe signal of the plurality of data strobe signals and provide data responsive, at least in part, to the data strobe signal of the plurality of data strobe signals.

8. A method, comprising:
receiving first and second data strobe signals;
selectively delaying a clock signal with a first adjustable delay to provide a first delayed clock signal;
selectively delaying the clock signal with a second adjustable delay to provide a second delayed strobe signal;
providing the first data strobe signal in accordance with the first delayed clock signal; and
providing the second data strobe signal in accordance with the second delayed clock signal.

9. The method of claim 8, wherein providing the first strobe signal in accordance with the first delayed clock signal comprises providing a pattern of alternating high and low logic levels.

10. The method of claim 8, wherein the first adjustable delay is based, at least in part, on a distance between a first circuit and a first memory and the second adjustable delay is based, at least in part, on a distance between a second circuit and a second memory.

11. The method of claim 8, further comprising:
receiving read data associated with the first strobe signal; and
deserializing the read data.

12. The method of claim 8, wherein selectively delaying a clock signal with a first adjustable delay to provide a first delayed clock signal comprises varying the adjustable delay during a training sequence.

13. The method of claim 8, wherein providing the first data strobe signal in accordance with the first delayed clock signal comprises providing the first data strobe signal through a first number of conductors and wherein providing the second data strobe signal in accordance with the second delayed clock signal comprises providing the second data strobe signal through a second number of conductors different than the first number of conductors.

14. A method, comprising:
receiving a first data strobe signal in accordance with a first clock signal;
receiving a timing control signal indicative of an adjustable delay;
providing a second clock signal, the second clock signal based, at least in part, on the adjustable delay; and
providing a second data strobe signal in accordance with the second clock signal.

15. The method of claim 14, wherein providing the second data strobe signal comprises serializing a plurality of signals to provide the second data strobe signal.

16. The method of claim 15, wherein serializing a plurality of signals to provide the second data strobe signal comprises providing a plurality of select signals based, at least in part, on the second clock signal, wherein the second data strobe signal is serialized based, at least in part, on the plurality of select signals.

17. The method of claim 14, further comprising:
providing a plurality of logic levels based, at least in part, on the first data strobe signal and sequentially providing each logic level of the plurality of logic levels based, at least in part, on a common clock signal.

18. The method of claim 14, wherein providing a second clock signal, the second clock signal based, at least in part, on the adjustable delay comprises providing a differential clock signal.

19. The method of claim 14, wherein providing a second data strobe signal in accordance with the second clock signal comprises:

providing the second data strobe signal to a memory; and wherein the method further comprises receiving data from the memory in accordance with the second data strobe signal.

20. The method of claim 14, wherein the first clock signal has a first frequency and the second clock signal has a second frequency higher than the first frequency of the first clock signal.

\* \* \* \* \*

UNITED STATES PATENT AND TRADEMARK OFFICE
CERTIFICATE OF CORRECTION

| | | |
|---|---|---|
| PATENT NO. | : 8,793,460 B2 | Page 1 of 1 |
| APPLICATION NO. | : 14/010159 | |
| DATED | : July 29, 2014 | |
| INVENTOR(S) | : Paul A. LaBerge et al. | |

It is certified that error appears in the above-identified patent and that said Letters Patent is hereby corrected as shown below:

In the Claims

In column 10, line 67, in claim 17, delete "signal" and insert -- signal; --, therefor.

Signed and Sealed this
Thirtieth Day of September, 2014

Michelle K. Lee
*Deputy Director of the United States Patent and Trademark Office*